(12) United States Patent
Hoshino et al.

(10) Patent No.: US 6,893,953 B2
(45) Date of Patent: May 17, 2005

(54) FABRICATION PROCESS OF A SEMICONDUCTOR DEVICE INCLUDING A CVD PROCESS OF A METAL FILM

(75) Inventors: Tomohisa Hoshino, Nirasaki (JP); Vincent Vezin, Nirasaki (JP); Gishi Chung, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/835,820

(22) Filed: Apr. 17, 2001

(65) Prior Publication Data

US 2002/0009872 A1 Jan. 24, 2002

(30) Foreign Application Priority Data

Apr. 17, 2000 (JP) ........................................ 2000-115187

(51) Int. Cl.$^7$ ........................ H01L 21/4763; H01L 21/44
(52) U.S. Cl. ........................ 438/618; 438/687; 438/633; 438/627
(58) Field of Search ................................ 438/618, 633, 438/627, 643, 687, 637, 638, 639, 660

(56) References Cited

U.S. PATENT DOCUMENTS

| | | | | |
|---|---|---|---|---|
| 5,296,404 A | * | 3/1994 | Akahori et al. | 437/173 |
| 5,665,659 A | * | 9/1997 | Lee et al. | 438/646 |
| 5,953,634 A | * | 9/1999 | Kajita et al. | 438/687 |
| 5,959,307 A | * | 9/1999 | Nakamura et al. | 257/14 |
| 6,159,857 A | * | 12/2000 | Liu et al. | 438/687 |
| 6,261,951 B1 | * | 7/2001 | Buchwalter et al. | 438/644 |
| 6,475,902 B1 | * | 11/2002 | Hausmann et al. | 438/627 |
| 6,693,030 B1 | * | 2/2004 | Subrahmanyan et al. | 438/637 |

* cited by examiner

Primary Examiner—Matthew Smith
Assistant Examiner—Chuong Anh Luu
(74) Attorney, Agent, or Firm—Pillsbury Winthrop Shaw Pittman LLP

(57) ABSTRACT

A method for fabricating a semiconductor device includes the steps of forming a barrier conductor layer on a substrate, exposing the barrier conductor layer to a first reducing gas atmosphere at an elevated substrate temperature, forming a metal film on the barrier conductor layer by a CVD process, and exposing the metal film to a second gas atmosphere at an elevated substrate temperature.

29 Claims, 14 Drawing Sheets

$SiH_4$ or $H_2$ or $NH_3$

FIG.19

| | BARRIER CONDUCTOR | METAL FILM | 1st ANNEAL GAS | 2nd ANNEAL GAS | PLASMA GAS | TAPE TEST | STRENGTH TEST (MPa) |
|---|---|---|---|---|---|---|---|
| EXP1 | TaN(PVD) | Cu(CVD) | NH₃ | H₂ | — | ○ | 68 |
| EXP2 | TaN(PVD) | Cu(CVD) | SiH₄ | H₂ | — | ○ | 74 |
| EXP3 | TaN(PVD) | Cu(CVD) | H₂ | H₂ | — | ○ | 69 |
| EXP4 | WN(CVD) | Cu(CVD) | SiH₄ | H₂ | — | ○ | 64 |
| EXP5 | WN(CVD) | Cu(CVD) | — | — | H₂ | ○ | 75 |
| COMP1 | TaN(PVD) | Cu(CVD) | — | H₂ | — | × | 31 |
| COMP2 | TaN(PVD) | Cu(CVD) | NH₃ | — | — | × | 44 |
| COMP3 | TaN(PVD) | Cu(CVD) | SiH₄ | — | — | × | — |
| COMP4 | TaN(PVD) | Cu(CVD) | H₂ | — | — | × | — |
| COMP5 | TaN(PVD) | Cu(PVD)+Cu(CVD) | — | H₂ | — | ○ | 69 |
| REF | | | | | | | |

FABRICATION PROCESS OF A SEMICONDUCTOR DEVICE INCLUDING A CVD PROCESS OF A METAL FILM

CROSS-REFERENCE TO RELATED APPLICATIONS

The present invention is based on Japanese Priority Application 2000-115187 filed on Apr. 17, 2000, the entire contents thereof are incorporated herein by reference.

BACKGROUND OF THE INVENTION

The present invention generally relates to fabrication of semiconductor devices and more particularly to a fabrication process of a semiconductor device including the step of forming a metal film on a barrier conductor layer by way of a CVD process.

In the fabrication process of semiconductor devices such as a wafer process, various metal films or patterns are formed on a substrate such as a Si wafer or a glass slab for providing interconnection. In the process of forming such metal films, it is practiced to provide a barrier conductor layer between the metal film and the underlying insulating layer such that diffusion of metal ions from the metal film into the underlying insulating layer is effectively blocked. Although the barrier conductor layer is generally called "barrier metal," various conductive compounds such as tungsten nitride (WN) are used for this purpose. Thus, the barrier metal layer is referred to in this specification as a barrier conductor layer.

A tungsten nitride layer may be formed by a CVD process of tungsten hexafluoride ($WF_6$) and ammonia ($NH_3$), or by a PVD process. Further, a metal film is provided on such a barrier conductor layer by various processes including a CVD process, a PVD process, or an electroplating process. By patterning such a metal film together with the underlying barrier conductor layer, interconnection patterns connecting various elements of the LSI are formed.

With the advancement in the art of device miniaturization, the number of the interconnection patterns formed on an LSI is increasing. Associated therewith, the density of the interconnection patterns is also increasing. By using a metal film such as a Cu film formed by a CVD process, it is possible to form the interconnection patterns on an LSI with large density and decreased pitch. On the other hand, the use of such a metal film formed by a CVD process raises the problem of peeling-off of the metal film, particularly when a CMP process is applied thereto in a process such as a dual damascene process. Further, such a poor adhesion between the metal film and the barrier conductor layer can become the cause of disconnection or short-circuit inside an LSI.

In the case the metal conductor layer is formed by a PVD process, this problem of poor adhesion is generally avoided. However, a PVD process is not a suitable process for forming densely arrayed interconnection patterns due to the problem of poor step coverage.

The reason why the adhesion of the metal conductor layer changes depending on the method of forming the metal conductor layer is understood as follows. In the case a metal film is formed by a PVD process, the amount of impurity elements incorporated into the metal film is very small. In the case the metal film is formed by a CVD process, on the other hand, the metal film tends to incorporate various impurity elements such as C or F, originating from the organic source compounds used in the CVD process, therein.

Meanwhile, recent, leading edge LSIs use a so-called multilayer interconnection structure for interconnecting various elements formed in the LSI electrically. In such a multilayer interconnection structure, plural interconnection layers are provided with intervening interlayer insulation films interposed therebetween. In order to interconnect different interconnection layers with each other or to interconnect an interconnection layer to a part of the active element such as a diffusion region formed in a substrate, the multilayer interconnection structure generally includes a number of contact holes or via holes filled with a conductive plug of Al or Cu.

In the case of advanced LSIs having a very large integration density and complex interconnection pattern, the diameter of the contact hole is decreased according to the design rule for increased integration density, while the depth of the contact hole is increased as a result of increase of the number of the interconnection layers used in the multilayer interconnection structure. As a result, there occurs an increase of aspect ratio (depth/diameter ratio) in such contact holes.

It should be noted that a metal film and a barrier conductor layer are provided so as to cover the bottom surface and the sidewall surface of contact holes also in the case the contact holes have a very large aspect ratio. In view of superiority of step coverage, the metal film and the barrier conductor layer are preferably formed by a CVD process, particularly when the contact hole has a large aspect ratio as noted before. Typically, a tungsten nitride film or a tantalum nitride (TaN) film formed by a CVD process is used for the barrier conductor layer while a Cu film formed by a CVD process is used for the metal film. On the other hand, such a conventional contact structure has suffered from the problem of poor adhesion as long as the barrier conductor layer and the metal film are formed by a CVD process.

SUMMARY OF THE INVENTION

Accordingly, it is a general object of the present invention to provide a novel and useful fabrication process of a semiconductor device wherein the foregoing problems are eliminated.

Another object of the present invention is to provide a fabrication process of a semiconductor device wherein the adhesion between a barrier conductor layer and a conductor film formed thereon is improved.

Another object of the present invention is to provide a method for fabricating a semiconductor device, comprising the steps of:

forming a barrier conductor layer on a substrate;

exposing said barrier conductor layer to a first gas atmosphere at an elevated substrate temperature;

forming, after said step of exposing said barrier conductor layer to said first gas atmosphere, a metal film on said barrier conductor layer by a CVD process; and exposing said metal film to a second gas atmosphere at an elevated substrate temperature.

exposing said metal film to a second reducing gas atmosphere at an elevated substrate temperature.

According to the inventions, adhesion between the barrier conductor layer and the metal film formed by the CVD process is improved substantially. The first gas may be any or more of a reducing gas such as silane, ammonia or hydrogen, while the second gas may be any or more of hydrogen and nitrogen. The first and second exposing steps my be conducted at a substrate temperature of 250–500° C. It is preferable to use a monosilane $SiH_4$ for the silane source compound, which is generally represented as $Si_nH_{2n+2}$. Further, it is preferable to conduct the first exposing process at the temperature of 300–450° C. and the second exposing process at the temperature of 300–400° C. Further, it is preferable to form the metal film by Cu and the barrier layer by Ta or TaN.

Another object of the inventions is to provide a method of fabricating a semiconductor device, comprising the steps of:

forming a barrier conductor layer of any of tungsten nitride or tantalum nitride on a substrate;

exposing said barrier conductor layer to a plasma of a reducing gas at an elevated temperature; and forming, after said step of exposing said barrier conductor layer to said plasma, a metal conductor layer on said barrier conductor layer by a CVD process.

According to the inventions, excellent blocking of element diffusion is achieved by using tungsten nitride or tantalum nitride for the barrier conductor layer. Further, adhesion between the barrier conductor layer and the metal film is improved. In the claimed inventions, the barrier conductor layer may be provided directly on the substrate or on an insulating film covering the surface of the substrate. Preferably, $H_2$ is used for the reducing gas. Further, it is preferable to conduct the plasma process at a temperature of 50–400° C., more preferably at a temperature of 100–250° C. In the present invention, it is further preferable to conduct an exposing step exposing the metal film to a gas after the step of forming the metal film at an elevated temperature of 250–500° C., more preferably at a temperature of 300–400° C. The metal film maybe formed of a Cu film.

Another object of the inventions is to provide a method of fabricating a semiconductor device, comprising the steps of:

alternately and repeatedly forming, on a substrate, and insulating film, a barrier conductor layer of any of tungsten nitride and tantalum nitride, and a metal film, said metal film being formed by a CVD process, wherein a step of exposing said barrier conductor film to a plasma of a reducing gas at an elevated temperature is interposed between said step of forming said barrier conductor layer and said step of forming said metal film.

In order to conduct the foregoing fabrication process, the present invention uses a semiconductor fabrication apparatus including a first processing unit that forms the barrier conductor layer directly on the substrate or on the insulating film on the substrate and a second processing unit that forms the metal film on the barrier conductor layer by a CVD process, wherein the semiconductor fabrication apparatus further includes a first reducing unit for exposing a specimen supplied thereto to a first reducing gas at an elevated temperature and a second reducing unit for exposing a specimen supplied thereto to a second reducing gas at an elevated temperature. Alternatively, the semiconductor fabrication apparatus may include a first processing unit forming a barrier conductor layer of tungsten nitride or tantalum nitride directly on a substrate or on an insulating film covering the substrate, a second processing unit forming a metal film by a CVD process, and a third processing unit exposing a specimen supplied thereto to a plasma of a reducing gas at an elevated temperature.

Other objects and further features of the present invention will become apparent from the following detailed description when read in conjunction with the attached drawings.

BRIEF DESCRIPTION OF THE DRAWINGS

FIGS. 11–19 are diagrams showing various process steps in the flowchart of FIG. 10.

DETAILED DESCRIPTION OF THE PREFERRED EMBODIMENTS

[First Embodiment]

Figure 1:
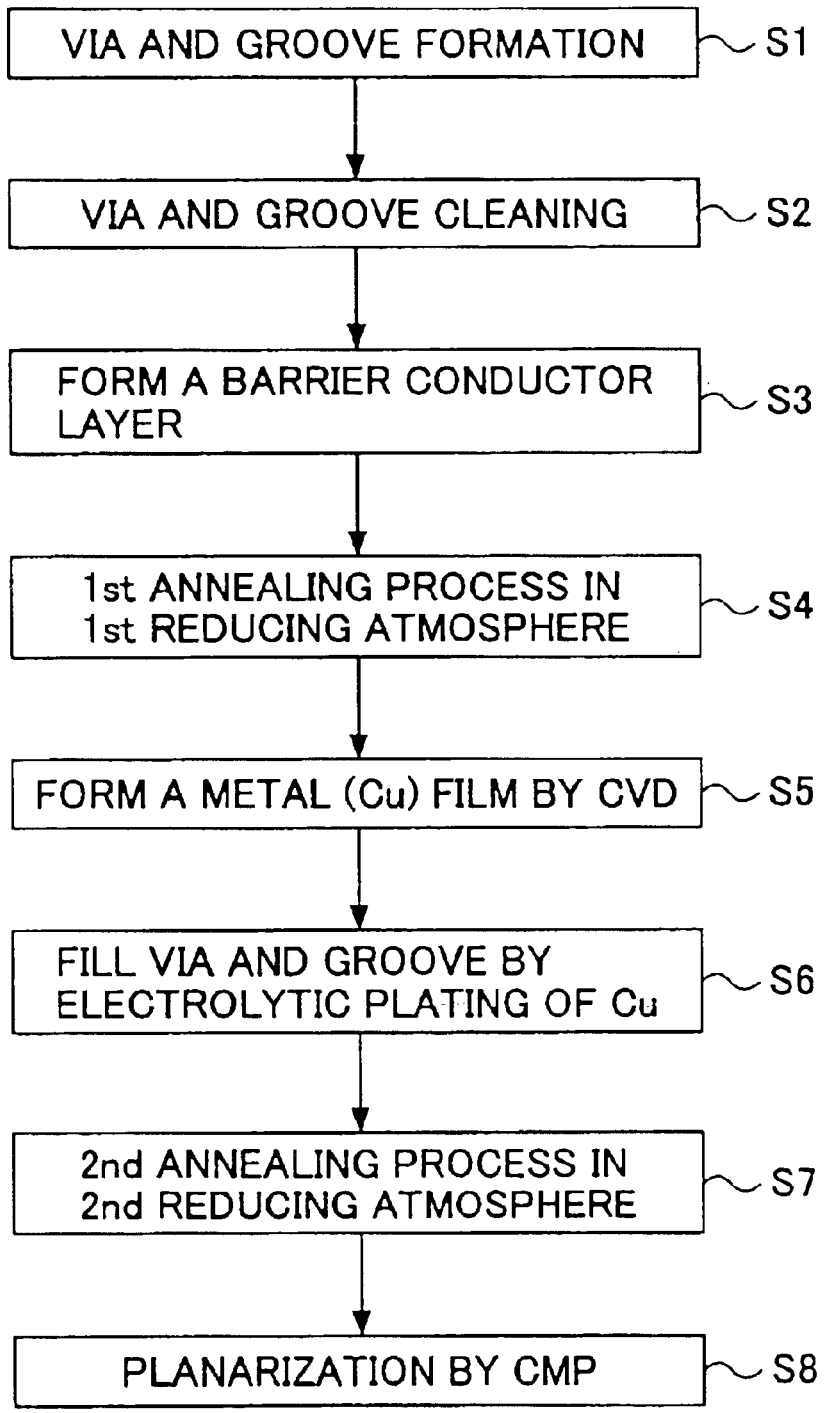
FIG. 1 is a flowchart showing the process flow of fabricating a semiconductor device according to a first embodiment of the present invention.

Hereinafter, the fabrication process of a semiconductor device according to a first embodiment of the present invention will be described with reference to FIG. 1 showing a flowchart and FIGS. 2–9 showing a process flow of the fabrication process of the semiconductor device.

Figure 2:
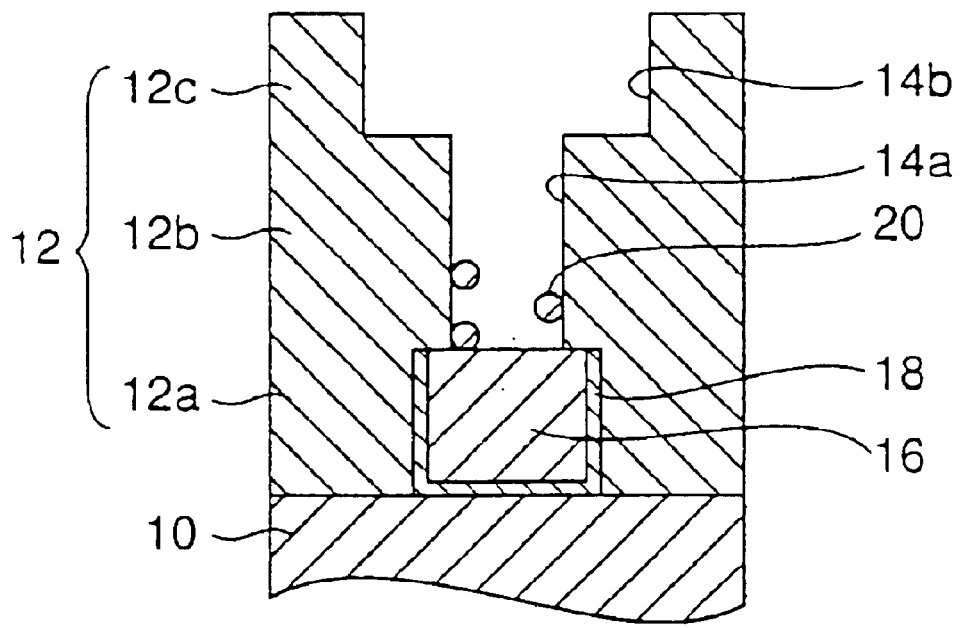
FIGS. 2–9 are diagrams showing various process steps in the flowchart of FIG. 1.

Referring to the flowchart of FIG. 1, the process starts with a step S1 in which a Si substrate 10 is covered by a plurality of insulating films 12a–12c consecutively as represented in FIG. 2, with intervening etching stopper films not illustrated. For the sake of simplicity, the insulating films 12a–12c are collectively designated by a reference numeral 12. In the step S1 corresponding to FIG. 2, a via hole 14a for a conductor plug and a groove 14b for an interconnection pattern are formed by an etching process. Thereby, the via hole 14a and the groove 14b form together a stepped structure in the cross-section of FIG. 2.

In the structure of FIG. 2, it should be noted that there is already formed an interconnection pattern 16 on the substrate 10 such that the interconnection pattern 16 is laterally supported by the insulating film 12a, wherein the interconnection pattern 16 may be a Cu pattern formed by a CVD process. Further, there is provided a barrier conductor layer 18 between the interconnection pattern 16 and the substrate 10 or between the interconnection pattern 16 and the insulating film 12a. The barrier conductor layer 18 may be formed of a TaN film formed by a PVD process.

Figure 3:
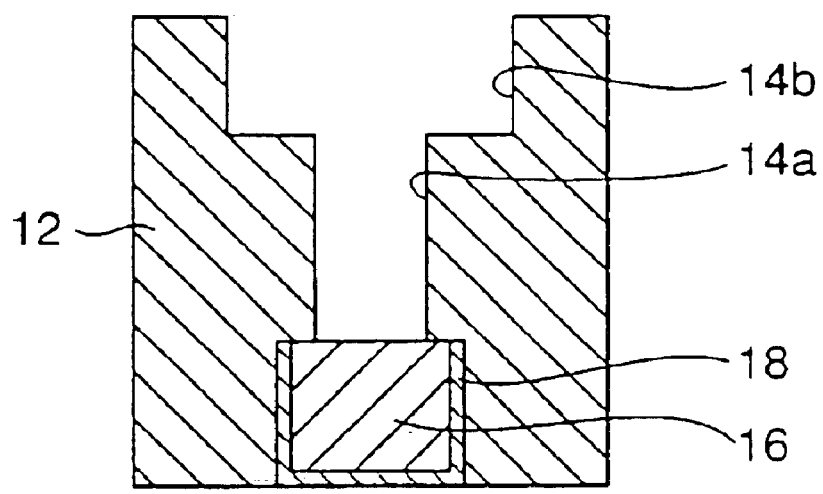

Next, in the step 2 of FIG. 1, a wet cleaning process is applied to the structure of FIG. 2 and any impurities 20, which may be a polymer residue formed at the time of the etching process of the via hole 14a or the groove 14b, are removed, as represented in FIG. 3. In FIGS. 3–9, illustration of the substrate 10 is omitted for the sake of simplicity.

Figure 4:
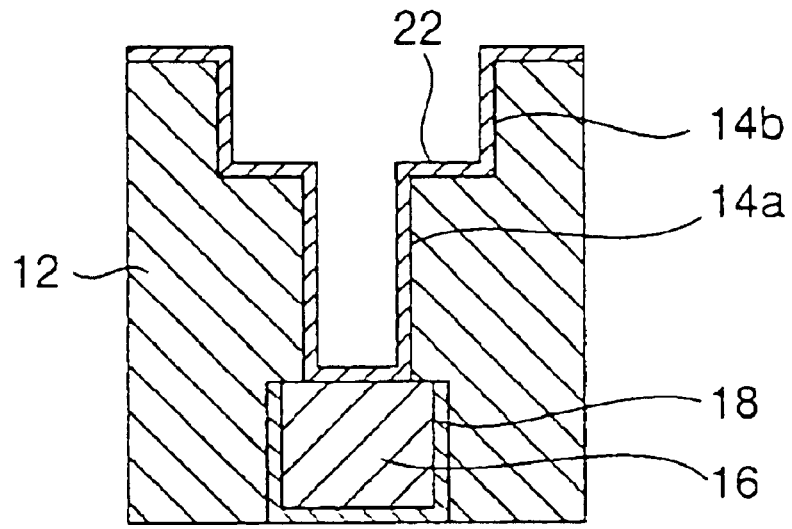
Figure 5:
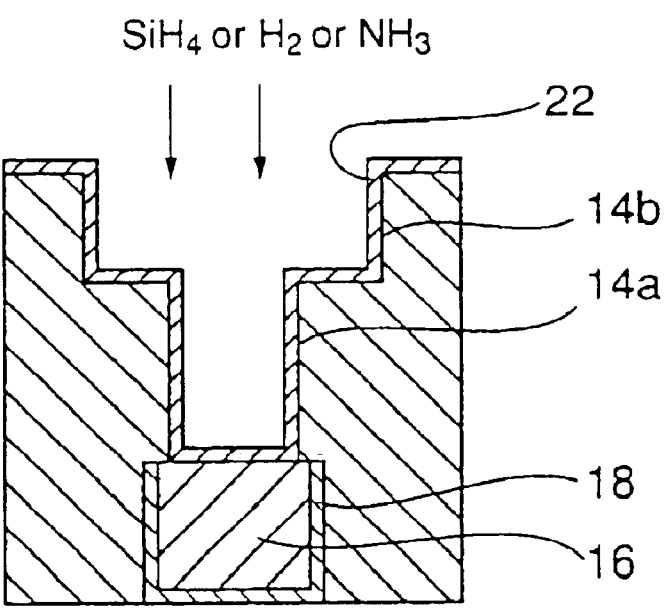

Next, in the step of FIG. 5 corresponding to the step S4 of FIG. 1, the structure of FIG. 4 is subjected to an annealing process conducted in a reducing gas atmosphere. Preferably, a silane ($Si_nH2_{n+2}$) gas, particularly a monosilane ($SiH_4$) gas, or an ammonia ($NH_3$) gas or a hydrogen gas ($H_2$) is used for the reducing gas, and the annealing process is conducted under a reduced pressure environment of about 4 Pa at the temperature of 250–500° C., preferably 450° C., for a duration of about 3 minutes. During the annealing process, one or more of the foregoing reducing gases are supplied. In the case of using $NH_3$, the $NH_3$ gas is supplied with a flow-rate of 200 SCCM in the maximum, while in the case of using $SiH_4$, the $SiH_4$ gas is supplied with a flow-rate of 5SCCM in the maximum. In the case of using $H_2$, the $H_2$ gas is supplied with a flow-rate of 500 SCCM in the maximum. Thereby, two or more gases may be mixed in the annealing process.

Next, in the step of FIG. 5 corresponding to the step S4 of FIG. 1, the structure of FIG. 4 is subjected to an annealing process conducted in a reducing gas atmosphere. Preferably, a silane ($Si_nH2_{n+2}$) gas, particularly a monosilane ($SiH_4$)

gas, or an ammonia (NH$_3$) gas or a hydrogen gas (H$_2$) or a nitrogen gas (N$_2$) is used for the reducing gas, and the annealing process is conducted under a reduced pressure environment of about 40 Pa at the temperature of 250–500° C., preferably 450° C., for a duration of about 3 minutes. During the annealing process, one or more of the foregoing reducing gases are supplied. In the case of using NH$_3$, the NH$_3$ gas is supplied with a flow-rate of 200 SCCM in the maximum, while in the case of using SiH$_4$, the SiH$_4$ gas is supplied with a flow-rate of 5 SCCM in the maximum. In the case of using H$_2$, the H$_2$ gas is supplied with a flow-rate of 500 SCCM in the maximum. Thereby, two or more gases may be mixed in the annealing process.

Figure 6:
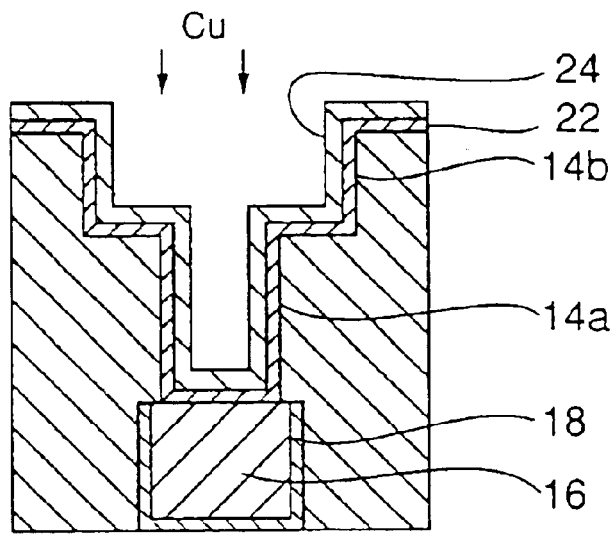

Next, the step of FIG. 6 corresponding to the step S5 of FIG. 1 is conducted, in which a metal film 24 of Cu is formed on the barrier conductor layer 22 by a CVD process.

More specifically, an organic metal containing a monovalent ion of Cu in an organic solvent is used as the source of the CVD process. The organic solvent may be based on hexafluoroacetylacetonate containing any of trimethylvinyl silane, aryltrimethyl silane, 2-methyl-1-hexene-3-ene, 3-hexyne-2,5-dimethoxy, hexafluoropropyne or triethoxyvinyl silane as the ligand for bonding with a Cu atom. The CVD process is conducted under a reduced pressure of 10–104 Pa, preferably under the pressure of 27–133 Pa, at the temperature of 140–240° C., preferably at the temperature of 150–210° C., together with a carrier gas of H2, He, N2, Ar, and the like, supplied with a flow-rate of 500 SCCM in the maximum.

Figure 7:
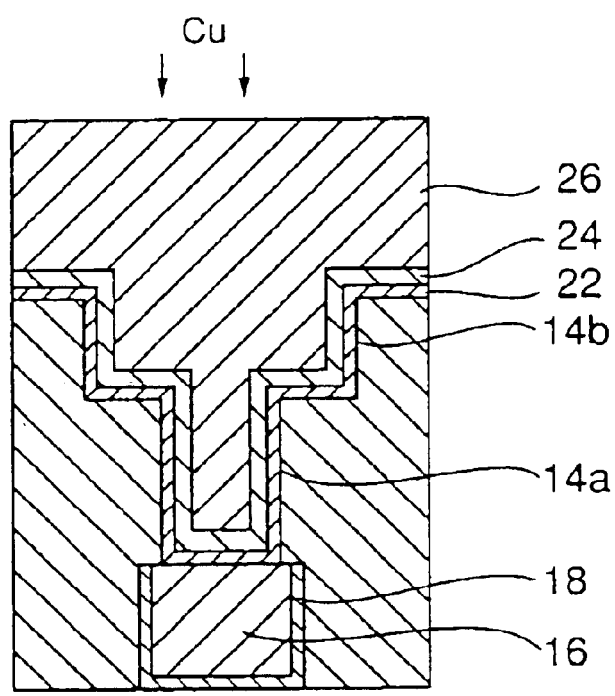

Next, in the step of FIG. 7 corresponding to the step S7 of FIG. 1, a Cu layer 26 is deposited on the metal film 24 by an electrolytic plating process such that the Cu layer 26 fills the via hole 14a and the groove 14b. In the state of FIG. 7, the Cu layer 26 further covers the top surface of the insulating film 12 via the barrier conductor layer 22 and the Cu film 24.

Figure 8:
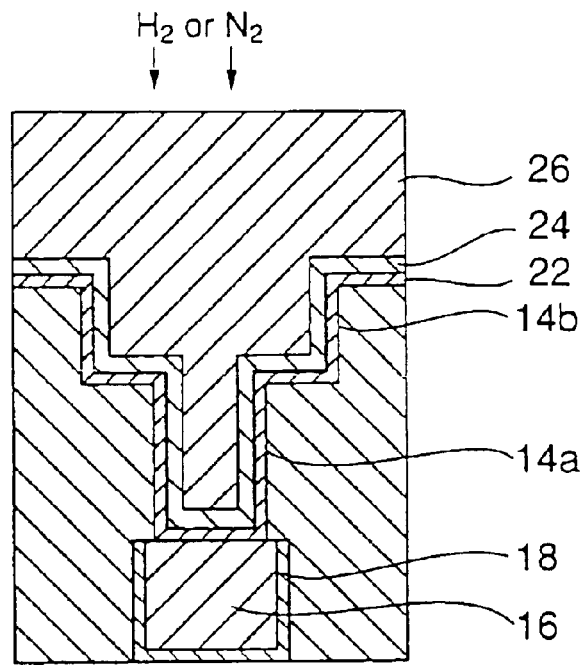

Next, in the step of FIG. 8 corresponding to the step S7 of FIG. 1, the Cu layer 26 thus formed is then subjected to an annealing process conducted in a atmosphere. More specifically, an atmosphere of any of NH$_3$, He, H$_2$, N$_2$ and Ar is used, and the annealing process is conducted under a pressure of at least 10 Pa at a temperature of 250–500° C. for a duration of about 0.5 minutes more. For example, the annealing process may be conducted at 350° C. over a duration of 5 minutes. The duration of the annealing process depends on the annealing temperature. When the annealing process is conducted at 350°, the H2 gas is supplied with a flow-rate of 400 SCCM. It should be noted that the order of the foregoing steps S6 and S7 my be exchanged.

Figure 9:
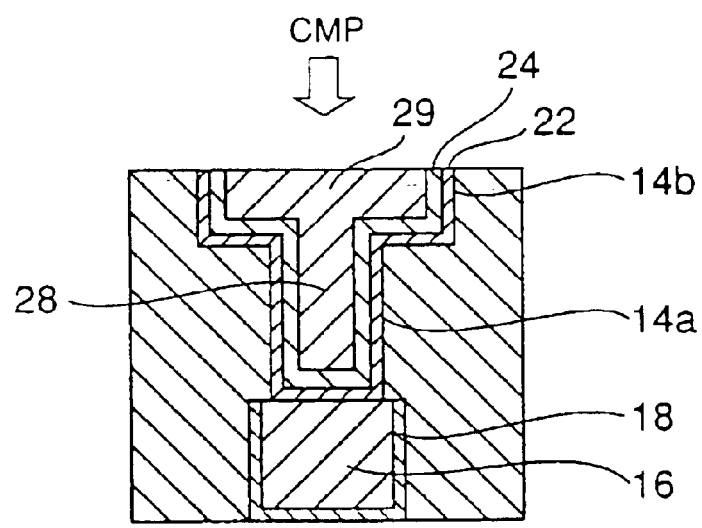

Finally, in the step of FIG. 9 corresponding to the step S8 of FIG. 1, a CMP (chemical mechanical polishing) process is applied to the structure of FIG. 8 and the Cu layer 26 locating above the insulating film 12 is removed. Typically, the CMP process is conducted on a platen while dripping slurry containing therein silica abrasive particles, until the top surface of the insulating film 12 is exposed. Thereby, a Cu conductor pattern 29 is formed so as to fill the groove 14b, together with a Cu plug 28 filling the via hole 14a. Thereby, the top surface of the Cu conductor pattern 29 forms a planarized flush surface with the top surface of the insulating film 12.

Further, by conducting other suitable processes commonly used in the fabrication process of semiconductor devices, the fabrication process of the present embodiment is completed.

[Second Embodiment]

Figure 10:
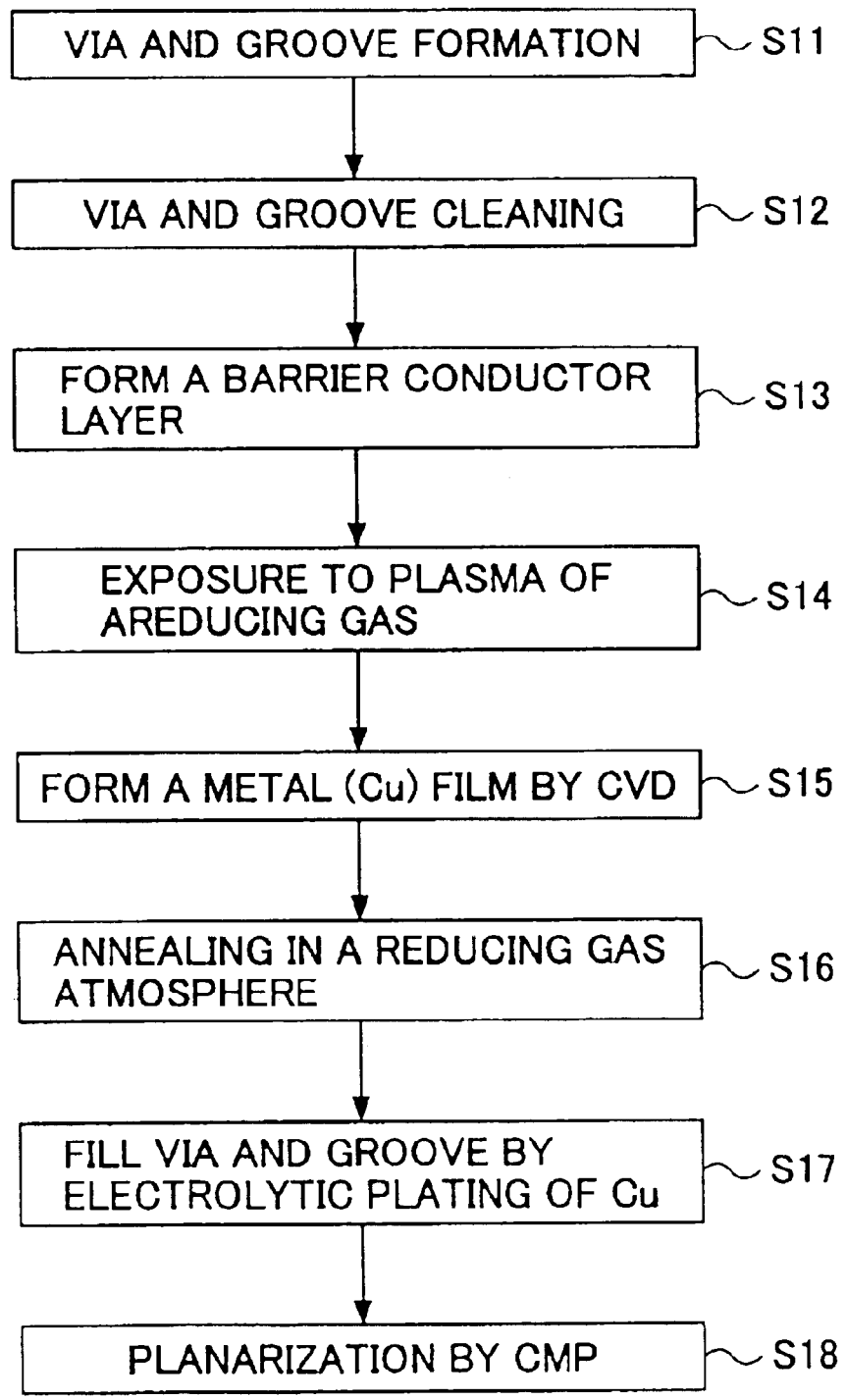
FIG. 10 is a flowchart showing the process flow of fabricating a semiconductor device according to a second embodiment of the present invention.

Next, the semiconductor fabrication process according to a second embodiment of the present invention will be described with reference to FIG. 10 showing a flowchart and FIGS. 11–18 showing the process flow. In the drawings, those parts corresponding to the parts described previously are designated by the same reference numerals and the description thereof will be omitted.

Figure 11:
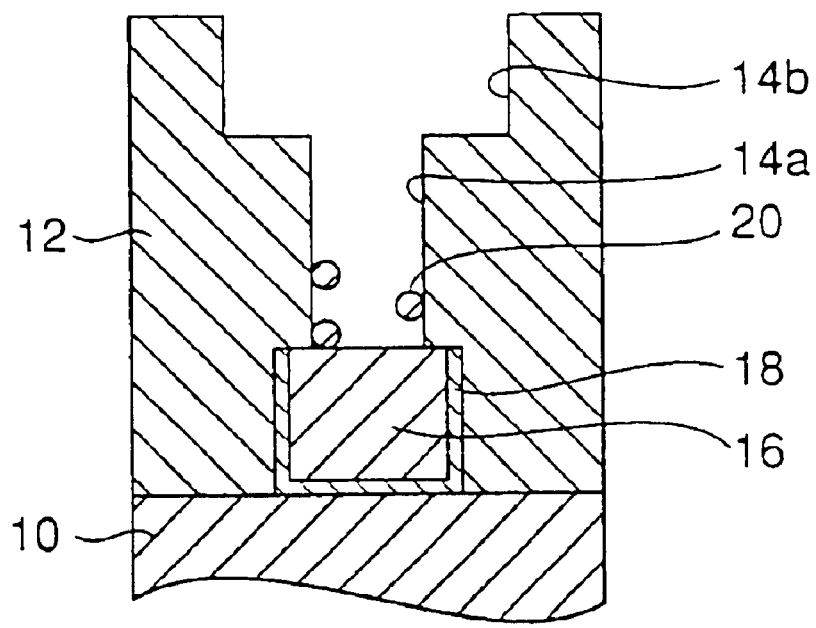

Referring to FIG. 11 corresponding to the step S11 of FIG. 10, the via hole 14a for a conductor plug and the groove pattern 14b corresponding to an interconnection pattern are formed in the insulating film 12.

Figure 12:
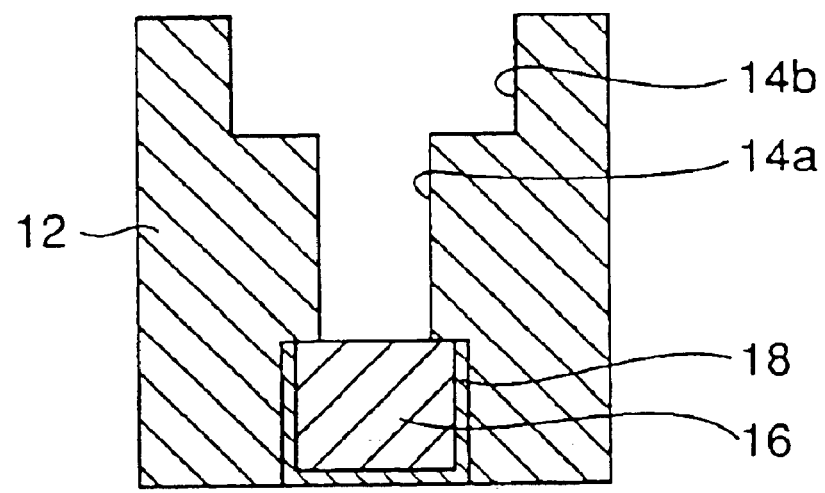

Next, in the step of FIG. 12 corresponding to the step S12 of FIG. 10, the via hole 14a and the groove 14b are subjected to a cleaning process.

Figure 13:
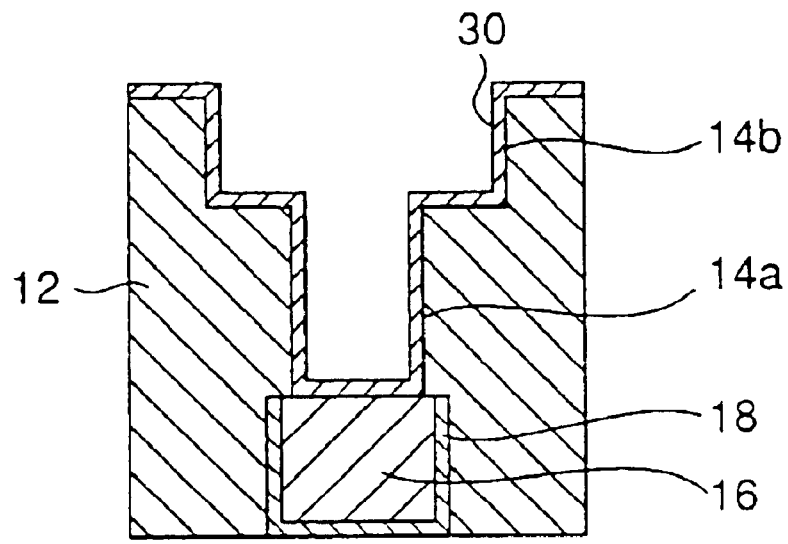

Next, a barrier conductor layer 30 of WN is formed in the step of FIG. 13 corresponding to the step S13 of FIG. 10 such that the barrier conductor layer 30 covers the sidewalls of the via hole 14a and the groove 14b and further the top surface of the conductor pattern 16 exposed at the bottom of the via hole 14a. The barrier conductor layer 30 may be formed by a CVD process conducted under a reduced pressure of 10–500 Pa at a temperature of 300–500° C., while using WF6 and NH3 as the source materials.

Figure 14:
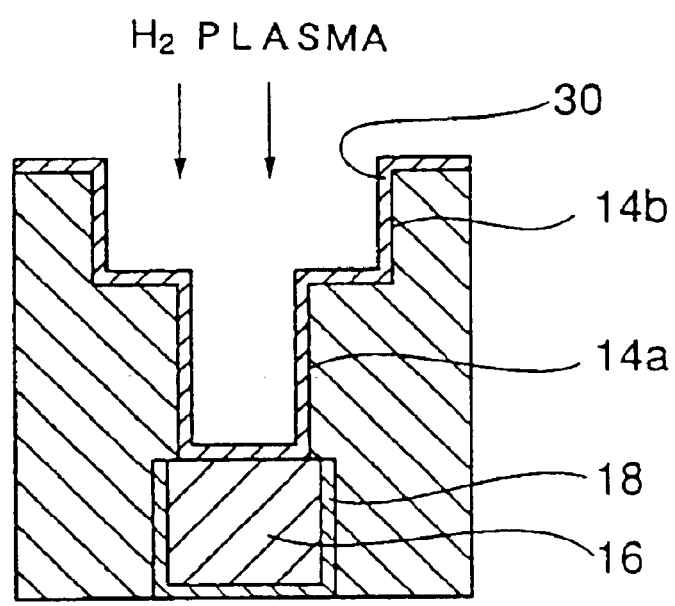

Next, the barrier conductor layer 30 thus formed is exposed to a plasma of a reducing gas in the step of FIG. 14 corresponding to the step S14 of FIG. 14. In the process of FIG. 14, a H$_2$ gas is supplied with a flow-rate of 1–500 SCCM as the reducing gas, and plasma is excited in the H$_2$ gas under the pressure of 1–500 Pa, by applying thereto a high frequency power of 400 kHz–13.65 MHz. The exposure is conducted at the temperature of 100–450° C.

Figure 15:
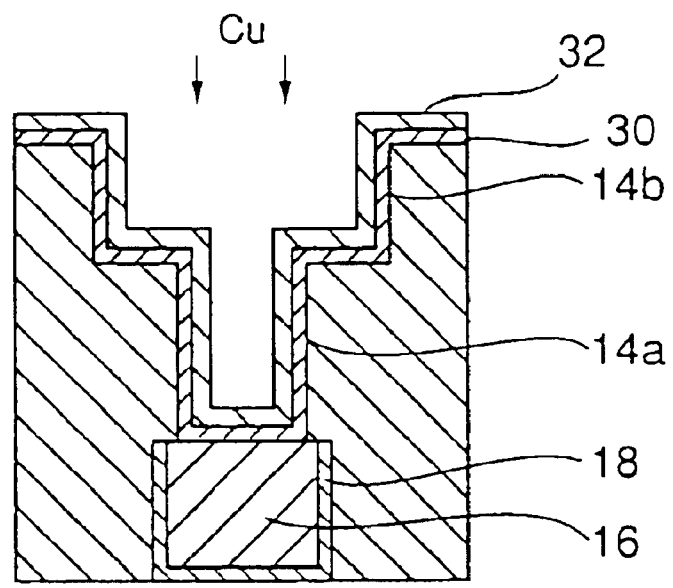

Next, in the step of FIG. 15 corresponding to the step S15 of FIG. 10, a metal layer 32 is deposited on the barrier conductor layer 30 by a CVD process similarly to the Cu film 24 of the previous embodiment.

Figure 16:
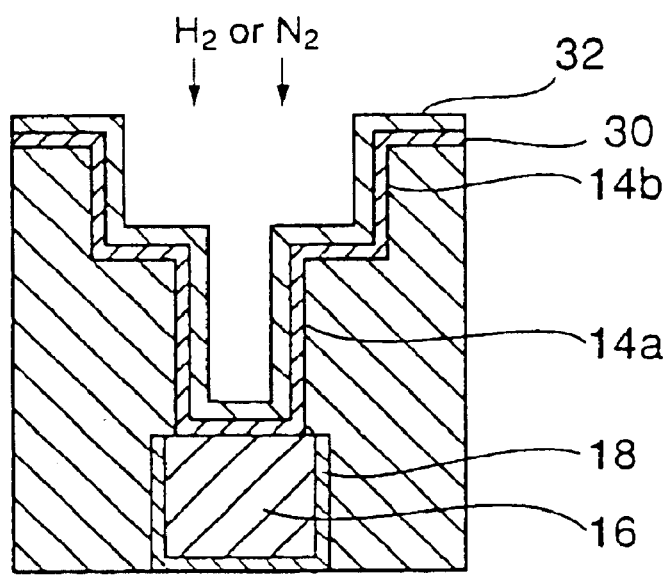

Next, in the step of FIG. 16 corresponding to the step S16 of FIG. 10, the structure of FIG. 15 is subjected to an annealing process conducted in a gas atmosphere. In the step of FIG. 16, an H$_2$ gas or an N$_2$ gas is used for the annealing atmosphere and the annealing is conducted under a reduced pressure of at least 10 Pa, preferably 670 Pa, at a temperature of 300–350° C. over a duration of about 5 minutes while supplying the reducing gas with a flow-rate of 400 SCCM. It should be noted that the duration of the annealing process depends on the annealin temperature.

Figure 17:
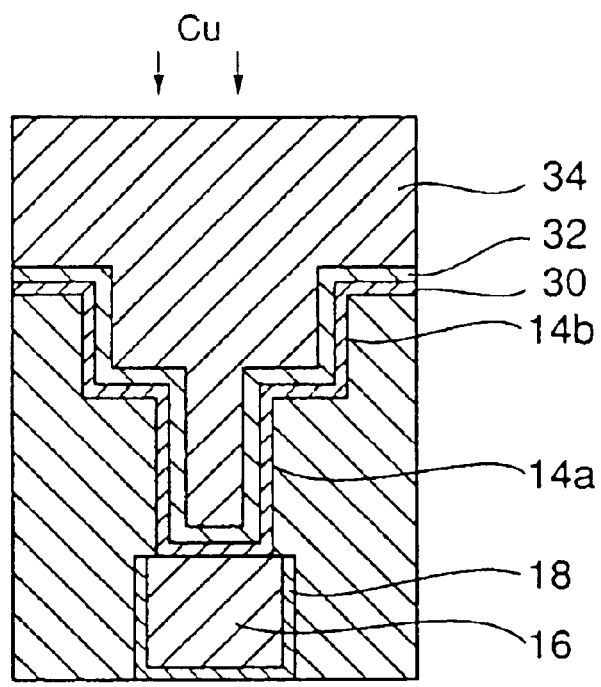

Next, in the step of FIG. 17 corresponding to the step S17 of FIG. 10, a Cu layer 34 is deposited on the Cu film 32 so as to fill the via hole 14a and the groove 14b completely, wherein the Cu layer 34 thus formed covers also the top surface of the insulating film 22 via the barrier conductor layer 30 and the Cu film 32.

Figure 18:
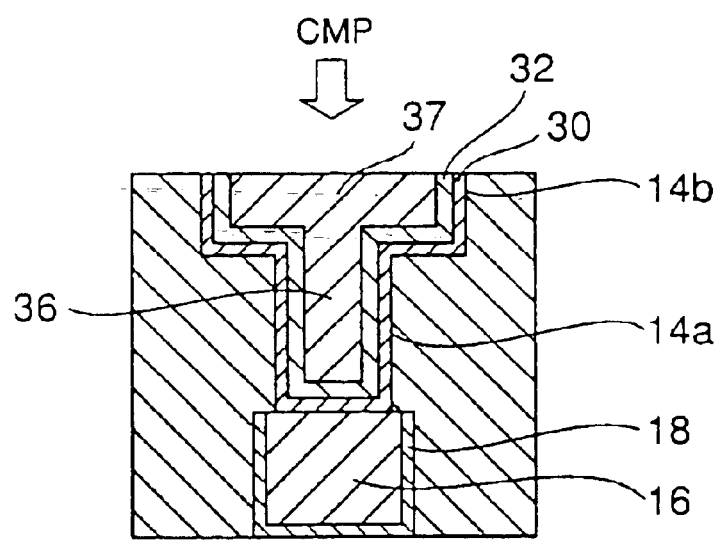

Next, in the step of FIG. 18 corresponding to the step S18 of FIG. 10, the Cu layer 34 above the top surface of the insulating layer 12 is removed by a CMP process and an interconnection pattern 37 filling the groove 14b is formed together with a conductor plug 36 filling the via hole 14a.

Further, by conducting other suitable processes commonly used in the fabrication process of semiconductor devices, the fabrication process of the present embodiment is completed.

FIG. 19 describe the result of adherence test conducted on the metal film of various structures, wherein EXP1–EXP4 correspond to the first embodiment and the barrier conductor layer of TaN or WN is subjected to a first annealing process in a reducing atmosphere before the Cu film is deposited thereon by a CVD process and the Cu film thus deposited on the barrier conductor layer is applied with a second annealing process in a reducing atmosphere. On the other hand, EXP5 corresponds to the second embodiment and the barrier conductor layer of WN is subjected to an $H_2$ plasma before the Cu film is deposited thereon by a CVD process. In EXP1–EXP5, the process conditions described previously are used.

Further, FIG. 19 shows the COMP1–COMP4 wherein COMP1–COMP4 correspond to EXP1–EXP4 respectively and represent the case in which at least one of the first and second annealing steps is omitted. Further, FIG. 19 shows REF, wherein REF represents the case in which a TaN barrier conductor layer is provided by a PVD process and a Cu film is provided by a CVD process after covering the TaN barrier conductor layer by a Cu film formed by a PVD process. In REF, the first annealing step of the present invention is eliminated. Otherwise, the experiments COMP1–COMP4 and REF of FIG. 19 are conducted under the conditions explained with reference to the first and second embodiments.

In the experiments of FIG. 19, the evaluation of the adhesion was made by a tape test and a tensile strength test, wherein the tape test was conducted by pulling a predetermined tape applied to the metal film and examining the peeling visually. On the other hand, the tensile strength test was conducted by using a Sebastian tester. In FIG. 19, the specimen that showed no peeling-off are marked by ○, while those specimen that showed a peeling-off are designated by X. Further, the tensile strength shown in FIG. 19 represents the tensile force observed at the moment the metal film peels off from the underlying barrier conductor layer.

Referring to FIG. 19, it can be seen that EXP1–EXP5 show an excellent adherence similar to REF. In the specimen COMP1–COMP4 in which the reduction process of the present invention is omitted, on the other hand, no satisfactory adherence is attained. While the specimen REF provides a satisfactory adhesion, the process used for REF is not suitable for a highly miniaturized semiconductor device having densely arrayed, fine interconnection patterns, as the lower Cu film formed on the barrier conductor layer is formed by a PVD process.

Further, FIG. 19 indicates, from the comparison of EXP1–EXP3 all showing a satisfactory adhesion, that a maximum adhesive strength of 74 MPa is achieved in EXP2 that uses $SiH_4$ in the first reduction step.

While not explained, it should be noted that EXP5 corresponding to the second embodiment of the present invention is the specimen that has been exposed to the air for a duration of more than 24 hours after the barrier conductor film is formed, before the plasma exposure process is conducted. Even in such a case, an excellent adhesion is achieved. In the event the plasma exposure process is replaced with the exposure process to a reducing gas atmosphere of $H_2$ and the like, the adhesion is deteriorated as can be seen in COMP3–COMP5.

The result of FIG. 19 can be interpreted as follows.

With regard to the first embodiment, an XPS analysis was conducted on the barrier conductor layer of the specimen of EXP2 and it was confirmed that there exists a Si layer of several atomic layer thickness in the vicinity of the top surface of the TaN film. Obviously, the Si layer is formed as a result of the exposure to $SiH_4$ used for the first reducing gas atmosphere. The existence of the Si atomic layers suggests a reaction between Si and TaN, which leads to the formation of a layer of TaSiN on the top surface of the TaN film. Thus, it is belived that the existence of the TaSiN layer on the top surface of the TaN film has caused the improvement of adhesion between the metal layer and the barrier conductor layer. Further, such a processing in a reducing atmosphere can cause a decrease of carbon and fluorine existing at the interface as impurities. Further, it is believed that a similar decrease of fluorine content and the formation of an adhesion layer are caused at the interface between the barrier conductor layer and the metal film also in the case of EXP1 and EXP3.

With regard to the second embodiment of the present invention, it is believed that the plasma processing has removed carbon, oxygen or fluorine atoms from the surface of the barrier conductor layer and this removal of the impurity elements has caused the observed improvement of adhesion between the metal conductor layer and the barrier metal layer.

FIGS. 20–25 show various arrangements of the cluster tools used in the semiconductor fabrication process that uses the present invention.

Figure 20:
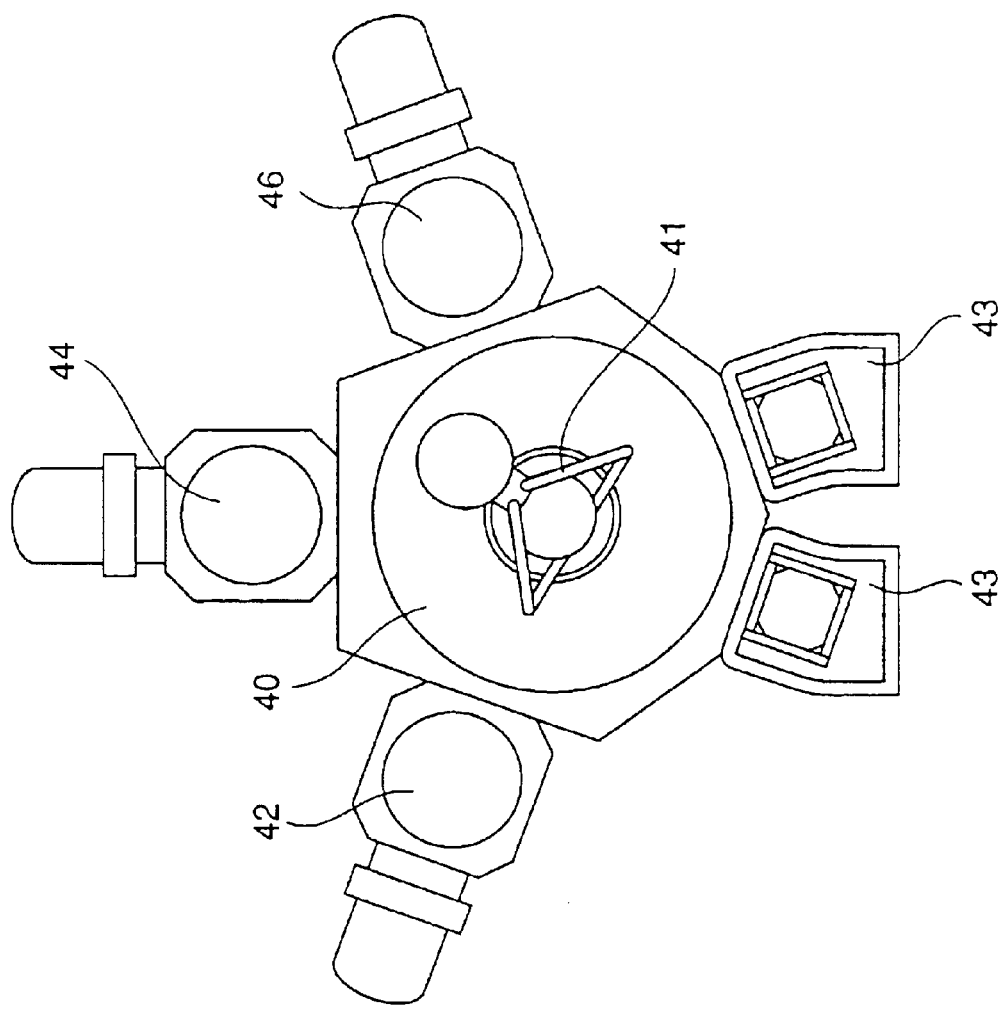
FIGS. 20–25 are diagrams showing the construction of various cluster-type apparatuses used in the present invention.

Referring to FIG. 20, a first processing chamber 42, a second processing chamber 44 and a third processing chamber 46 are disposed so as to surround a transfer chamber 40 including therein a transfer arm 41, wherein the transfer arm 41 transfers a wafer to be processed one by one from a load-lock chamber 43 to any of the foregoing processing chambers 42, 44 and 46 or from any of the foregoing processing chambers 42, 44 and 46 to another processing chamber 42, 44 and 46, or from any of the foregoing processing chambers 42, 44 and 46 to the lock-lock chamber 43.

Here, it should be noted that the first chamber 42 is used for a preprocessing while the second chamber 44 is used for the formation of the barrier conductor layer and includes a processing apparatus for carrying out the first exposure process exposing the barrier conductor film to the first reducing gas atmosphere. Alternatively, the second chamber 44 may include an apparatus for conducting a plasma exposure process according to the second embodiment of the present invention. On the other hand, the third chamber 46 is used for the formation of the metal film and includes a processing apparatus for carrying out the second exposure process exposing the metal film to the second reducing atmosphere.

In the cluster apparatus of FIG. 20, the wafer to be processed can be handled in a reduced pressure environment throughout the process applied thereto without exposing the same to the air, by evacuating the transfer chamber 40. Alternatively, the transfer chamber 40 may be in the atmospheric pressure. In this case, each of the first through third chambers is provided with an air-lock mechanism. Further, other processing chambers may be added to the construction of FIG. 20 such that the processing chambers circle around the transfer chamber 40.

Figure 21:
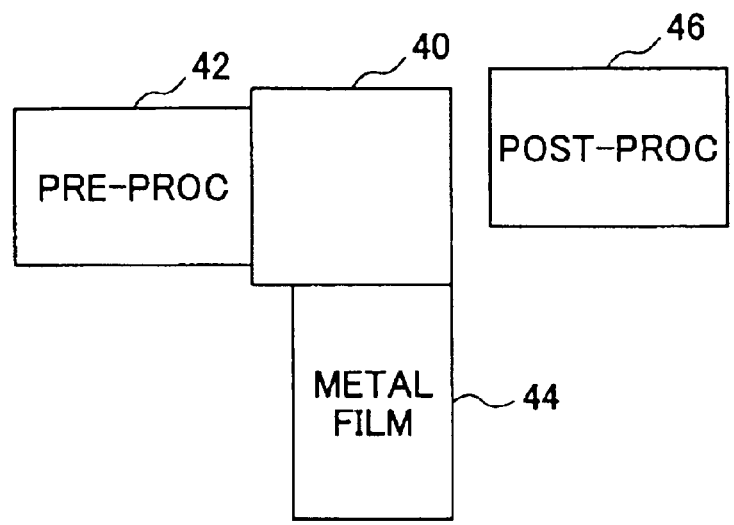

FIG. 21 is a medication of the cluster apparatus of FIG. 20 in which the processing chamber 46 is disconnected from the transfer chamber 40 and the number of the processing chambers around the transfer chamber 40 is reduced. In the construction of FIG. 21, the processing chamber 46 becomes a stand-alone chamber.

Figure 22:
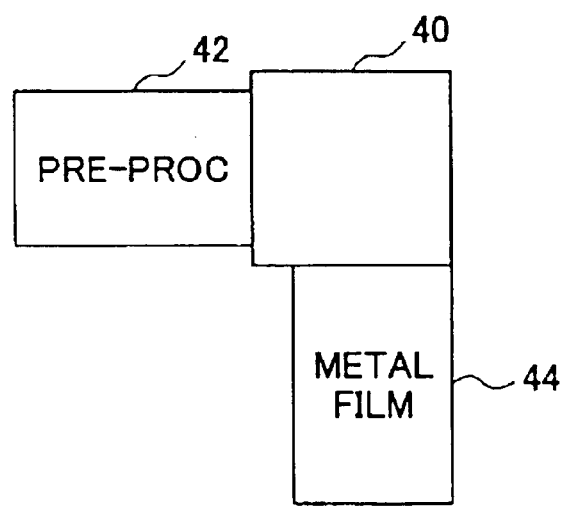

FIG. 22 is another modification of the apparatus of FIG. 20 in which the processing chamber 46 is removed and the processing chamber 44 is used for both the processing of the barrier conductor layer and the processing of the metal film.

Figure 23:
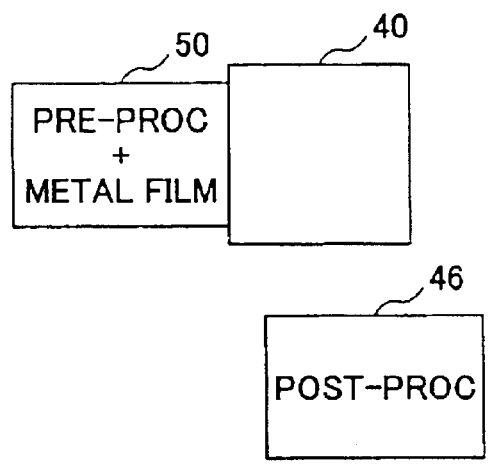

FIG. 23 shows a further modification of the apparatus of FIG. 20 in which the processing chamber 46 is disconnected, and the preprocessing and the processing of the barrier conductor layer are conducted in a single processing chamber 50.

Figure 24:
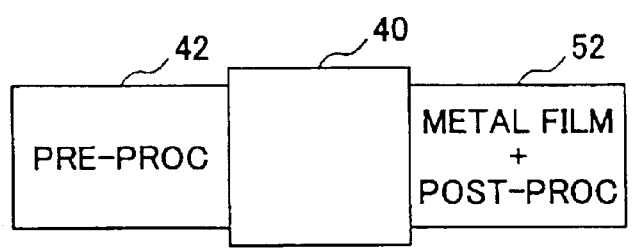

FIG. 24 shows a further modification of the apparatus of FIG. 22 or 23 in that the pre-processing chamber 46 and the processing chamber 52 for the post-processing and the metal film formation are provided with an opposing relationship with respect to the transfer chamber 40.

Figure 25:
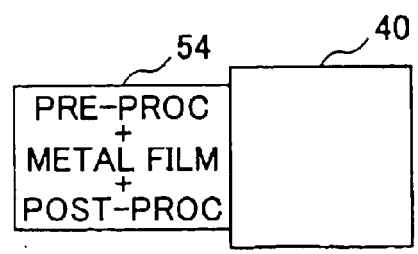

Further, FIG. 25 shows a modification in which only single processing chamber 54 provided adjacent to the transfer chamber 40 is used for all of the pre-processing, the metal film formation and the post-processing.

In the cluster-type apparatus explained above with reference to FIGS. 20–25, it should be noted that the type described with reference to FIG. 20, FIG. 24 or FIG. 25 can achieve the entire processing without exposing the wafer to the air.

On the other hand, the construction of FIG. 21 or 23 is suitable in the case when it is preferable to conduct the post-processing separately. For example, the construction of FIG. 21 or FIG. 23 is suitable when the Cu film is formed by an electrolytic plating process. Further, such a construction is suitable in the case the throughput of the processing is different between various process steps and it is preferable to apply a batch process to the wafers processed by the single-wafer process having a high throughput. Further, the construction of FIG. 21 or 23 is preferable in the case some of the process steps provides a heavy load to the processing chamber and the processing chamber tends to be damaged after a short operation. By using the construction of FIG. 21 or 23 in such a situation, it is possible to switch the processing chamber to a reserved chamber when the processing chamber is damaged.

Further, the construction of FIG. 25 has an advantageous feature of low cost in view of using a single processing chamber commonly for a number of different process steps, although the construction of FIG. 25 has a drawback of low throughput due to the need of long time for changing the process condition and associated problem of accuracy of temperature control.

In conclusion, the constructions of FIGS. 21, 20 and 22 are preferable according to this order.

Further, the present invention is not limited to the embodiments described heretofore, but various variations and modifications can be made without departing from the scope of the invention.

What is claimed is:

1. A method for fabrication a semiconductor device, comprising:

forming a barrier conductor layer on a substrate;

exposing said barrier conductor layer to a first gas atmosphere containing a hydride gas at an elevated substrate temperature;

forming, after said exposing said barrier conductor layer to said first gas atmosphere, a metal film on said barrier conductor layer by a CVD process; and exposing said metal film to a second gas atmosphere at an elevated substrate temperature.

2. A method as claimed in claim 1, wherein said hydride gas is selected from any of silane and ammonia.

3. A method as claimed in claim 1, wherein said exposing said barrier conductor layer to said first reducing gas atmosphere is conducted at a temperature between 250° C. and 500° C.

4. A method as claimed in claim 1, wherein said second gas atmosphere includes hydrogen and/or nitrogen.

5. A method as claimed in claim 1, wherein said step of exposing said metal film to said second gas atmosphere is conducted at a temperature between 250° C. and 500° C.

6. A method as claimed in claim 1, wherein said metal film is a Cu film.

7. A method as claimed in claim 1, wherein said barrier conductor layer is formed of any of Ta or TaN.

8. A method of fabricating a semiconductor device, comprising:

forming a barrier conductor layer of any of tungsten nitride or tantalum nitride on a substrate;

exposing said barrier conductor layer to an atmosphere containing a hydride gas at an elevated temperature; and forming, after exposing said barrier conductor layer to said atmosphere containing the hydride gas, a metal film on said barrier conductor layer by a CVD process.

9. A method as claimed in claim 8, wherein said hydride gas is at least one of silane and ammonia.

10. A method as claimed in claim 8, further comprising, after said forming said metal film, applying a thermal annealing process to said metal film.

11. A method as claimed in claim 10, wherein said thermal annealing process is conducted at a temperature between 250° C. and 500° C.

12. A method as claimed in claim 8, wherein said metal film is formed of Cu.

13. A method of fabricating a semiconductor device, comprising:

alternately and repeatedly forming, on a substrate, an insulating film, a barrier conductor layer of any of tungsten nitride and tantalum nitride, and a metal film, said metal film being formed by a CVD process, wherein a step of exposing said barrier conductor film to an atmosphere containing a hydride gas at an elevated temperature is interposed between said step of forming said barrier conductor layer and said step of forming said metal film.

14. A method as claimed in claim 1, wherein said step of forming said barrier conductor layer is conducted by a PVD process.

15. A method as claimed in claim 1, wherein said second reducing gas atmosphere includes nitrogen.

16. A method as claimed in claim 5, wherein said step of exposing said metal film to said second gas atmosphere is conducted under a pressure of about 40 Pa.

17. A method for fabrication a semiconductor device, comprising:

forming a barrier conductor layer on a substrate;

exposing said barrier conductor layer to a first gas atmosphere containing a nitrogen gas at an elevated substrate temperature;

forming, after said exposing said barrier conductor layer to said first gas atmosphere, a metal film on said barrier conductor layer by a CVD process; and exposing said metal film to a second gas atmosphere at an elevated substrate temperature.

18. A method as claimed in claim 17, wherein said exposing said barrier conductor layer to said first reducing gas atmosphere is conducted at a temperature between 250° C. and 500° C.

19. A method as claimed in claim 17, wherein said second gas atmosphere comprises at least one of hydrogen, nitrogen, or a combination of hydrogen and nitrogen.

20. A method as claimed in claim 17, wherein said exposing said metal film to said second gas atmosphere is conducted at a temperature between 250° C. and 500° C.

21. A method as claimed in claim 17, wherein said metal film is a Cu film.

22. A method as claimed in claim 17, wherein said barrier conductor layer is formed of any of Ta or TaN.

23. A method as claimed in claim 17, wherein said forming said barrier conductor layer is conducted by a PVD process.

24. A method as claimed in claim 17, wherein said second reducing gas atmosphere includes nitrogen.

25. A method of fabricating a semiconductor device, comprising:

forming a barrier conductor layer of any of tungsten nitride or tantalum nitride on a substrate;

exposing said barrier conductor layer to an atmosphere containing a nitrogen gas at an elevated temperature; and forming, after exposing said barrier conductor layer to said atmosphere containing the nitrogen gas, a metal film on said barrier conductor layer by a CVD process.

26. A method as claimed in claim 25, further comprising, after forming said metal film, applying a thermal annealing process to said metal film.

27. A method as claimed in claim 26, wherein said thermal annealing process is conducted at a temperature between 250° C. and 500° C.

28. A method as claimed in claim 25, wherein said metal film is formed of Cu.

29. A method of fabricating a semiconductor device, comprising:

alternately and repeatedly forming, on a substrate, an insulating film, a barrier conductor layer of any of tungsten nitride and tantalum nitride, and a metal film, said metal film being formed by a CVD process, wherein a step of exposing said barrier conductor film to an atmosphere containing a nitrogen gas at an elevated temperature is interposed between said step of forming said barrier conductor layer and said step of forming said metal film.

* * * * *